(12) United States Patent
Jansson (10) Patent No.: US 10,740,991 B2
(45) Date of Patent: Aug. 11, 2020

(54) METHOD AND DEVICE FOR CONTROLLING AN ELECTRIC OR A HYBRID ELECTRIC VEHICLE

(71) Applicant: VOLVO TRUCK CORPORATION, Gothenburg (SE)

(72) Inventor: Andreas Jansson, Gothenburg (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 66 days.

(21) Appl. No.: 15/536,173

(22) PCT Filed: Jan. 16, 2015

(86) PCT No.: PCT/EP2015/000069
§ 371 (c)(1),
(2) Date: Jun. 15, 2017

(87) PCT Pub. No.: WO2016/112926
PCT Pub. Date: Jul. 21, 2016

(65) Prior Publication Data
US 2017/0352203 A1     Dec. 7, 2017

(51) Int. Cl.
*G07C 5/08* (2006.01)
*G01R 31/367* (2019.01)
(Continued)

(52) U.S. Cl.
CPC .......... *G07C 5/0808* (2013.01); *B60L 3/0061* (2013.01); *B60L 58/12* (2019.02);
(Continued)

(58) Field of Classification Search
None
See application file for complete search history.

(56) References Cited

U.S. PATENT DOCUMENTS

| 2010/0198536 A1* | 8/2010 | Hess ............... G01R 31/392 |
| | | 702/63 |
| 2011/0202494 A1 | 8/2011 | Shin et al. |

(Continued)

FOREIGN PATENT DOCUMENTS

| CN | 102868000 A | 1/2013 |
| CN | 103163781 A | 6/2013 |

(Continued)

OTHER PUBLICATIONS

International Search Report dated Sep. 8, 2015) for corresponding International App. PCT/EP2015/000069.
(Continued)

*Primary Examiner* — Carlos R Ortiz Rodriguez
(74) *Attorney, Agent, or Firm* — Venable LLP; Jeffri A. Kaminski (57) ABSTRACT

A method is provided for controlling electrical components in a vehicle including multiple traction voltage systems, wherein each traction voltage system includes at least one electrical component, and which electrical component has the same function in each traction voltage system, the method involving the steps of monitoring and registering the state of health of each electrical component over time; predicting a predetermined parameter for each electrical component, which parameter is related to a future operating state inhibiting the use of the components; determining a control strategy for each electrical component based on the state of health of the electrical components to balance the parameters towards a common value; and controlling the electrical components based on the determined control strategy.

16 Claims, 4 Drawing Sheets

(51) Int. Cl.
- *G01R 31/387* (2019.01)
- *G01R 31/392* (2019.01)
- *B60W 20/00* (2016.01)
- *B60L 3/00* (2019.01)
- *B60L 58/22* (2019.01)
- *B60L 58/12* (2019.01)
- *G01R 31/00* (2006.01)
- *G05B 23/02* (2006.01)
- *H02J 7/00* (2006.01)

(52) U.S. Cl.
CPC ............ *B60L 58/22* (2019.02); *B60W 20/00* (2013.01); *G01R 31/006* (2013.01); *G01R 31/367* (2019.01); *G01R 31/387* (2019.01); *G01R 31/392* (2019.01); *G05B 23/0294* (2013.01); *H02J 7/0014* (2013.01); *H02J 7/0021* (2013.01); *B60L 2220/42* (2013.01); *B60L 2260/50* (2013.01); *B60W 2510/248* (2013.01); *Y02T 10/646* (2013.01)

(56) References Cited

U.S. PATENT DOCUMENTS

| | | |
|---|---|---|
| 2012/0008107 A1 | 4/2012 | Skelton |
| 2012/0081075 A1 | 4/2012 | Skelton |
| 2013/0001313 A1 | 1/2013 | Denniston, Jr. |
| 2013/0013138 A1 | 1/2013 | Lu et al. |
| 2013/0073222 A1 | 3/2013 | Shin et al. |
| 2013/0158755 A1 | 6/2013 | Tang et al. |
| 2014/0052318 A1 | 2/2014 | Yoshida et al. |

FOREIGN PATENT DOCUMENTS

| | | |
|---|---|---|
| CN | 103648827 A | 3/2014 |
| CN | 103687749 A | 3/2014 |
| EP | 2124517 A2 | 11/2009 |
| JP | 2003-333707 A | 11/2003 |
| JP | 2007-259612 A | 10/2007 |
| JP | 2013184584 A | 9/2013 |
| JP | 2014039412 A | 2/2014 |
| JP | 2014079066 A | 5/2014 |
| JP | 2014079067 A | 5/2014 |

OTHER PUBLICATIONS

International Preltrntnary Report on Patentability (dated Jan. 25, 2017) for corresponding International App. PCT/EP2015/000069.

Japanese Official Action (dated Dec. 27, 2018) for corresponding Japanese App. 2017-537425.

Chinese Office Action dated Sep. 9, 2019, issued in CN Application No. 201580073472.2.

Brazil Office Action dated Apr. 21, 2020 in corresponding Brazil Application No. BR112017015237.1, 4 pages.

\* cited by examiner

METHOD AND DEVICE FOR CONTROLLING AN ELECTRIC OR A HYBRID ELECTRIC VEHICLE

BACKGROUND AND SUMMARY

The invention relates to a method and device for controlling the operation of similar components in the electrical system of an electric or a hybrid electric vehicle to improve the life time of the components used in the system, and for optimizing system performance in real-time using the state of health information.

Electric or hybrid electric vehicles comprise an electrical system comprising a set of interacting and/or interdependent components functioning as a whole. Over time, each of the various components in a given system may degrade at different relative rates. Moreover, as some components tend to serve a more critical role than others in the overall function of the system, the degradation of a given component can uniquely impact system performance relative to degradation of the other components in the same system. For instance, a gradual degradation of an energy storage unit, such as a high voltage battery pack or a super-capacitor can cause an appreciable degradation in overall vehicle performance, while degraded electrical components, such as power electronics components or switches, may significantly reduce the vehicle's ability to start or function in some operating modes.

Electric or hybrid electric vehicles can be provided with on-board diagnostic systems for measuring variables representing the state and/or the performance of a particular component relative to predetermined values or calibrated thresholds. For instance, it is common to measure a battery output voltage and compare this value to calibrated high/low voltage thresholds. Battery voltage measurements can also be used for calculating the current state of health of the battery. An operator may be made aware of the need to repair a given component when the component is no longer functioning properly with respect to such thresholds. System function typically improves when a severely degraded component is eventually repaired. However, immediate repair is not always a convenient or desirable option.

Larger electric or hybrid electric vehicles, such as buses or trucks can comprise several identical or substantially identical components. For instance, an articulated vehicle can be provided with a traction battery for each driven axle. In a conventional hybrid electric vehicle, individually controllable driven axles are controlled to provide desired traction properties for the vehicle. During normal operation, an on-board diagnostic system can monitor the state and/or the performance of multiple individual components, alerting the operator when any one component malfunctions.

It is desirable to provide an improved method for monitoring the state and/or the performance of multiple individual components of the same type.

In the subsequent text, the term "life time" is used to denote the useful life time of a component, from the time of installation in a vehicle until such a time when an operational state requiring replacement of the component is detected. The term "remaining operating time" is mainly used to denote the useful life time of a component, from the time of installation in a vehicle until such a time when an operational state requiring repair of the component is detected. However, the "remaining operating time" can also be the life time of a component. Both terms indicate a parameter relating to a future point in time when the vehicle becomes inoperative due to component degradation or failure.

According to preferred embodiment, the invention relates to a method for controlling electrical components in a vehicle comprising multiple traction voltage systems, wherein each traction voltage system comprises at least one electrical component, and which electrical component has the same function in each traction voltage system. The vehicle can be an electric or a hybrid electric vehicle.

The method involves performing the steps of:
monitoring and registering the state of health of each electrical component over time;
predicting a predetermined parameter for each electrical component, which parameter is related to a future operating state inhibiting the use of the components;
determining a control strategy for each electrical component based on the state of health of the electrical components to balance the parameters towards a common value;
controlling the electrical components based on the determined control strategy.

The above method steps are carried out continuously in a loop or intermittently at constant or variable intervals during operation of the vehicle. A central controller is provided for collecting sensor data from components to be monitored, for performing required calculations, and for carrying out control strategies for the monitored components.

This method allows two or more identical or substantially identical components of the same type to be monitored so that the state of health (SOH) for each respective component be maintained between common upper and lower limits required for achieving the common parameter. The upper limit is determined by the component or components having the relatively higher SOH values. Hence, if the SOH for one component falls below a predetermined lower limit, which limit can be set as a percentage or a number of percentage points relative to the component having the highest SOH or relative to an average SOH for two or more components having the highest SOH, then the component or components having higher SOH values are operated so that the SOH of all such electrical components are maintained between the upper and lower limits. Ideally, the predicted parameter of the component having the lowest SOH can be moved up to the predicted parameter of the component having the highest SOH. In this example, the higher of the predicted parameters is deemed to be the desired common value. If this is not achievable, then the SOH of the electrical components are maintained between the upper and lower limits to balance the parameters towards a common value between the highest and the lowest predicted parameters. This ensures that all identical or substantially identical components of the same type are worn or degraded at the same or substantially the same rate.

According to one example, the method involves determining a control strategy for each of the electrical components using a current derivative of the state of health for each of the at least two electrical components.

Alternatively, or in addition, the method involves calculating a predicted parameter relating to the life time or remaining operating time for each electrical component based on a current value of the derivative of the state of health for each electrical component. Subsequently, the two or more electrical components are controlled based on the determined control strategy to equalize the predicted remaining operating times of the electrical components. According to the method a control strategy is selected that reduces the loading on at least the electrical component having the shortest predicted remaining operating time. Consequently, the selected control strategy increases the loading on at least the electrical component having the longest predicted remaining operating time.

In this context, the predicted remaining operating time can be the remaining time to a functional state requiring repair or replacement of either component. Alternatively, the predicted remaining operating time is the remaining life time of the electrical components. In both cases, an operating state inhibiting the use of the components is detected.

The method according to the invention can be used for monitoring and controlling two or more identical or substantially identical traction battery packs or super-capacitors. Alternatively, the electrical components can be two or more traction motors each connected to an individual driven axle one or more pairs of traction wheel motors, each motor being connected to a wheel on a driven axle. For instance, if the components comprise electric traction motors then the central controller can monitor one or more of average power consumption, peak current, resistance measurements, rotor speed, temperature, magnetic field strength or motor fault data for each of the motors. If the components comprise high voltage battery packs then the central controller can monitor one or more of internal resistance, capacitance, state of charge for any or all of a set of battery cells battery pack, charging rate, temperature or peak power.

According to a further alternative, the electrical components can be two or more power electronics components for controlling the traction voltage, such as inverters, DC/DC converters, AC/DC converters, pre-charge circuit components, battery chargers, or similar.

The central controller can include a set of aging models for the respective component. In this context, the term "aging model" refers to any device or software approach which estimates or predicts the degradation or deterioration of a given component over time, e.g., curves, formulas, lookup tables, recorded in a memory in the central controller. The set of aging models can model historic maintenance or contain statistical data describing the past performance of substantially identical components. The central controller can use such models and/or detected data for calculating and monitoring the SOH of the respective components, in order to estimate the degradation rate and remaining useful life of the individual component.

The present invention also relates to a computer program comprising program code means for performing the above method steps for controlling electrical components in a vehicle traction voltage system when said program is run on a computer. The invention also relates to a computer readable medium carrying a computer program comprising program code means for performing the above method steps for controlling electrical components in a vehicle traction voltage system when said program product is run on a computer. Further, the invention relates to a control unit for controlling electrical components in a vehicle traction voltage system, the control unit being configured to perform the above method steps.

The present invention also relates to a computer program, computer program product and a storage medium for a computer all to be used with a computer for executing the method as described in any one of the above examples.

The present invention also relates to a vehicle comprising multiple traction voltage systems, and where a control unit is arranged to perform the steps of the method as described in one of the above examples.

BRIEF DESCRIPTION OF THE DRAWINGS

In the following text, the invention will be described in detail with reference to the attached drawings. These schematic drawings are used for illustration only and do not in any way limit the scope of the invention. In the drawings.

DETAILED DESCRIPTION

Figure 1A:
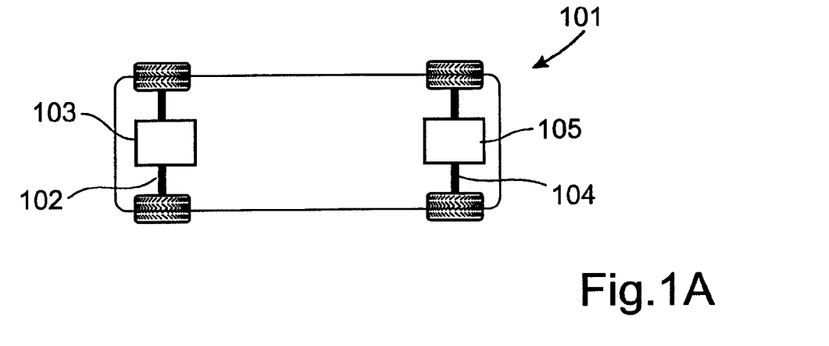
FIGS. 1A-D show schematic vehicles suitable for use with a propulsion system according to the invention.

FIGS. 1A-D show schematic vehicles suitable for use with a propulsion system according to the invention. FIG. 1A shows a schematic vehicle 101 having two driven axles 102, 104, where each driven axle can be driven by a first and a second electric drive unit 103, 105 comprising one of more electric motors. Hence, one motor can be arranged to drive one axle, or one motor can be arranged to drive each wheel on an axle. In this example, the first and second electric drive units 103, 105 are located in a front and a rear part of the vehicle 101, respectively. Alternatively, at least one axle can be driven by a hybrid drive unit, comprising an electric motor and an internal combustion engine.

Figure 1B:
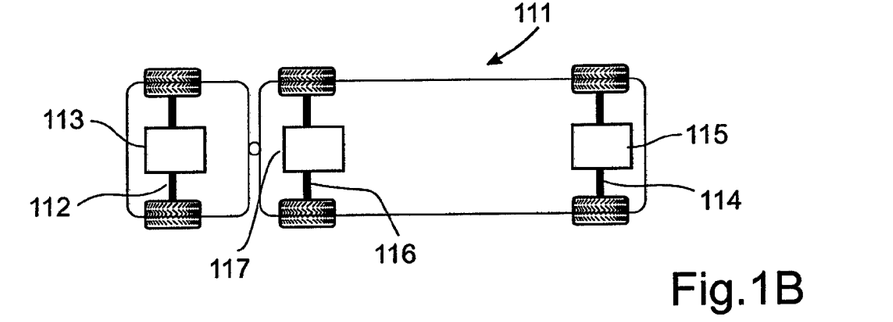

FIG. 1B shows a schematic vehicle 111 having three driven axles 112, 114, 116, where each driven axle can be driven by an electric drive unit 113, 115, 117, comprising one or more electric motors. As indicated above, one motor can be arranged to drive one axle, or one motor can be arranged to drive each wheel on an axle. In this example, a first electric drive unit 113 is located in a front part of an articulated vehicle and a second and third electric drive unit 115, 117 are located in a rear part of the articulated vehicle 101. Alternatively, at least one axle can be driven by a hybrid drive unit, comprising an electric motor and an internal combustion engine. This arrangement is suitable for construction machines, such as articulated dumpers.

Figure 1C:
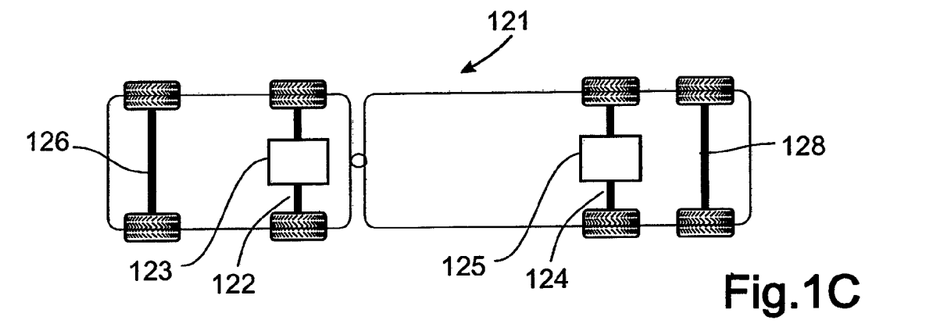

FIG. 1C shows a schematic vehicle 121 having two driven axles 122, 124, where each driven axle can be driven by an electric drive unit 123, 125 comprising one or more electric motors. Alternatively, at least one axle can be driven by a hybrid drive unit, comprising an electric motor and an internal combustion engine. One motor can be arranged to drive one axle, or one motor can be arranged to drive each wheel on an axle. In this example, the first electric drive unit 123 is located in a front part of an articulated truck, which front part also comprises a steerable axle 126. The second electric drive unit 125 is located in a rear part of the vehicle 121, which rear part also comprises a trailing axle 128. This arrangement is suitable for trucks comprising tractor-trailer combinations.

Figure 1D:
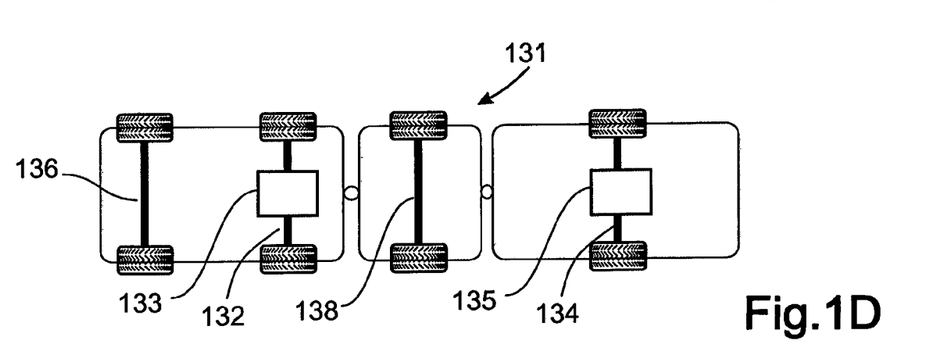

FIG. 1D shows a schematic vehicle 131 having two driven axles 132, 134, where each driven axle can be driven by an electric drive unit 133, 135, comprising one or more electric motors. Alternatively, at least one axle can be driven by a hybrid drive unit, comprising an electric motor and an internal combustion engine. One motor can be arranged to drive one axle, or one motor can be arranged to drive each wheel on an axle. In this example, the first electric drive unit 133 is located in a front part of an articulated bus, which front part also comprises a steerable axle 136. The second electric drive unit 135 is located in a rear part of the vehicle 131, which rear part is connected to an intermediate part comprising a non-driven axle 138. This arrangement is suitable for buses comprising multiple articulated sections, where at least two sections comprise driven axles.

In the examples shown in FIGS. 1A-D, the vehicles comprise two or more driven axles wherein each driven axle has at least one electric drive unit connected to a junction box and at least one energy storage system forming an electrical system. Electrical systems of this type will be described in further detail in connection with FIG. 2 below. The individual electrical systems are preferably, but not necessarily, galvanically isolated from each other during normal operation, when one or more energy storage systems in the vehicle is not being charged from an external power source.

The above are only selected examples of vehicles suitable for use with the inventive method. The vehicles can comprise all electric drive units, all hybrid electric drive units, or a combination of electric and hybrid electric drive units. Other vehicles having the driven axles mounted in alternative locations in the front and/or rear and one or more intermediate vehicle parts are conceivable within the scope of the invention.

Figure 2:
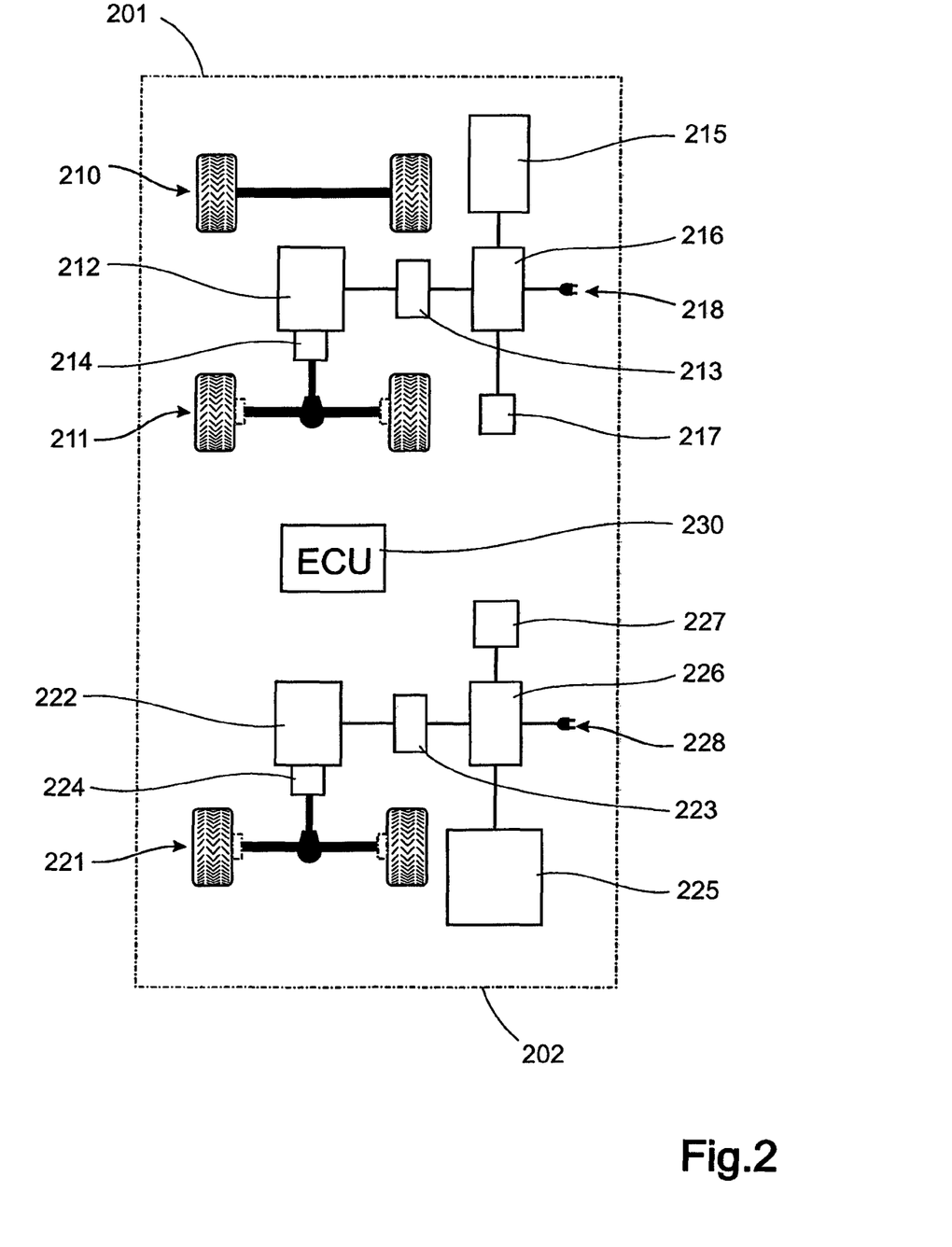
FIG. 2 shows a schematic vehicle according to a first embodiment of the invention.

FIG. 2 shows a schematic vehicle according to an exemplary embodiment of the invention. For this particular example, an articulated vehicle similar to that shown in FIG. 1D has been selected. The vehicle comprises a front 201 and a rear vehicle part 202 which are connected to and articulated relative to each other. The front vehicle part 201 is arranged at a front end of the vehicle and has a front steerable axle 210 and a rear driven axle 211. The rear vehicle part 202 has a single driven axle 221.

The front vehicle part 201 has a first drive unit in the form of a traction voltage system. The traction voltage system comprises an electric motor/generator 212 connected to a transmission 214 for driving the driven axle 211. The electric motor/generator 212 can supply a propulsive torque to the driven axle 211, or be driven by the driven axle 211 to generate electric power during regeneration. The electric motor/generator 212 is connected to an electric motor drive (EMD) 213, also termed a power electronics converter (PEC), which supplies three-phase AC current to the motor/generator 212. The electric motor drive (EMD) 213 is in turn connected to a first energy storage system, in this case a high voltage battery pack 215 via a high voltage junction box 216. The traction voltage system comprises a number of high voltage DC buses making up an operative high voltage bus, which buses connected a number of electrical components to the high voltage junction box 216 by connectors (not shown). In the example shown in FIG. 2, the high voltage junction box 216 can also be used for joining and distributing high voltage buses to a number of different electrical components.

A first DC bus connects the high voltage junction box 216 to the electric motor drive (EMD) 213 and ultimately to the electric motor/generator 212 via a second bus. The first DC bus is also referred to as a high voltage traction bus, while the second bus is a three-phase AC bus. The electric motor drive (EMD) 213 comprises power electronics for controlling the electric motor/generator 212, including a motor control unit (MCU). Similarly, the transmission 214 is controlled by a transmission electronic control unit (not shown). In this example, the electric motor/generator 212 is an AC-motor supplied by the electric motor drive (EMD) 213. However, it is also possible to use a DC-motor within the scope of the invention.

A third DC bus connects the junction box 216 to the high voltage battery pack 215. The high voltage battery pack 215 is provided with a battery management unit (BMU), comprising a power connector and electronics (not shown) for controlling the battery pack 215 and the cells making up the battery pack. The power connector typically comprises a pre-charge circuit having a pre-charge module for controlling power-up of a load. The pre-charge module can be of a solid state type and configured as a solid state module in series with a pre-charge resistor, for example a 10 ohm pre-charge resistor and that are together connected across the contacts of a contactor or relay. The relay is a main relay or main contactor for switching power on and off to the load. The load can be, for instance, the electric motor drive (EMD) 213 or a power take-off (PTO) load. The power that is switched on and off by this relay is the electric power from the high voltage battery pack 215. The on/off state of the relay is controlled by the BMU.

Additional DC buses can be provided for connecting the junction box 216 to a DC/DC convener 217 and a low voltage DC bus (not shown). The operation of such a DC/DC converter and the power supply to the low voltage DC bus will not be described in further detail here. The junction box can also be connected to one or more electric Power Take-Off loads (ePTO:s), or auxiliary high voltage electrical loads (not shown). A further DC bus connects the junction box 216 to a charge interface adapter 218 (schematically indicated by a socket) connected to the grid via a charger (not shown).

The junction box 216 and each control unit can also be connected to a wire harness in order to communicate with a central electronic control unit (not shown), for instance via a CAN bus. The wire harness can be connected to the central electronic control unit and is used for transmitting/receiving control and/or sensor signals to/from the control units. The central electronic control unit can be a separate unit or be arranged adjacent or in the junction box 216.

In the same way as the front vehicle part 201, the rear vehicle part 202 has a first drive unit in the form of a traction voltage system. The traction voltage system comprises an electric motor/generator 222 connected to a transmission 224 for driving the driven axle 221. The electric motor/generator 222 can supply a propulsive torque to the driven axle 221, or be driven by the driven axle 221 to generate electric power during regeneration. In a hybrid electric vehicle, the rear vehicle part 202 could be provided with an internal combustion engine connected to a transmission 224 for driving the driven axle 221, separately or together with the electric motor/generator 222.

The electric motor/generator 222 is connected to an electric motor drive (EMD) 223, also which in turn is connected to a first energy storage system, in the form of a high voltage battery pack 225 via a high voltage junction box 226. The traction voltage system comprises a number of high voltage buses making up an operative high voltage bus, which buses are connected to the high voltage junction box 226 by connectors (not shown). In the example shown in FIG. 2, the high voltage junction box 226 can also be used for joining and distributing high voltage buses to a number of different electrical components.

A first DC bus connects the high voltage junction box 226 to the electric motor drive (EMD) 223 and ultimately to the electric motor/generator 222 via a second bus. The first DC bus is a two-phase high voltage traction bus, while the second bus is a three-phase AC bus. The electric motor drive 223 comprises power electronics for controlling the electric motor/generator 222, including a motor control unit (MCU). As in the front vehicle part 201, the transmission 224 is controlled by a transmission electronic control unit (not shown). In this example, the electric motor/generator 222 is a three-phase AC-motor supplied by the electric, motor drive (EMD) 223, as described above. However it is also possible to use a DC-motor and a second DC bus within the scope of the invention.

A third DC bus connects the junction box 226 to the high voltage battery pack 225. The high voltage battery pack 225 is provided with a battery management unit (BMU), comprising a power connector and electronics (not shown) for controlling the battery pack 225 and the cells making up the battery pack. The power connector typically comprises a pre-charge circuit having a pre-charge module for controlling power to a load. The pre-charge module can be of a solid state type and configured as a solid state module in series with a pre-charge resistor, for example a 10 ohm pre-charge resistor and that are together connected across the contacts of a contactor or relay. The relay is a main relay or main contactor for switching power on and off to the load. The load can be an inverter arranged in the electric motor drive 223. The power that is switched on and off by this relay is the electric power from the high voltage battery pack 225. The on/off state of the relay is controlled by the BMU.

Additional DC buses can be provided for connecting the junction box 226 to a DC/DC converter 227 and a low voltage DC bus (not shown). The operation of such a DC/DC converter and the power supply to the low voltage DC bus will not be described in further detail here. The junction box can also be connected to one or more electric Power Take-Off loads (ePTO:s), or auxiliary high voltage electrical loads (not shown). A further DC bus connects the junction box 226 to a charge interface adapter 228 (schematically indicated by a socket) connected to the grid via a charger (not shown).

The junction box 226 and each control unit can also be connected to a wire harness in order to communicate with a central electronic control unit (not shown), for instance via a CAN bus. The wire harness can be connected to the central electronic control unit and is used for transmitting/receiving control and/or sensor signals to/from the control units. The central electronic control unit can be a separate unit or comprise of multiple units or be arranged adjacent or in the junction box 226.

Alternatively, the charge interface adapters 217, 227 can be replaced by a common DC/DC converter and a control unit (not shown) for controlling the output voltage to the respective traction voltage system of the front and the rear part of the vehicle. Such a DC/DC converter can be connected directly to the respective junction box of the front and the rear part of the vehicle eliminating the need for charging switch units. The DC/DC converter would keep the front vehicle part 201 galvanically isolated from the rear and intermediate vehicle parts 202, 202 during normal (non-charging) operating conditions.

A central controller 230 is in communication with the various components of the system, either directly or through communication over a communications bus with corresponding electronic control units (not shown) of each component. The controller estimates the states of health (SOH) of the various components comprising the system based on input signals from component related sensors (not shown) or from predetermined operating parameters for specific components.

The system includes using a sensor array to measure and record a set of current performance values for each of the components. The central controller 230 then calculates an SOH for each of the components by processing the recorded current performance values through an SOH model. Additionally, the method include processing a set of possible system control strategies through a component and/or system life time model to estimate the effect of implementing each of the control strategies, and selecting a system control strategy giving an optimal component time, subject to performance and remaining useful life time thresholds.

Figure 3A:
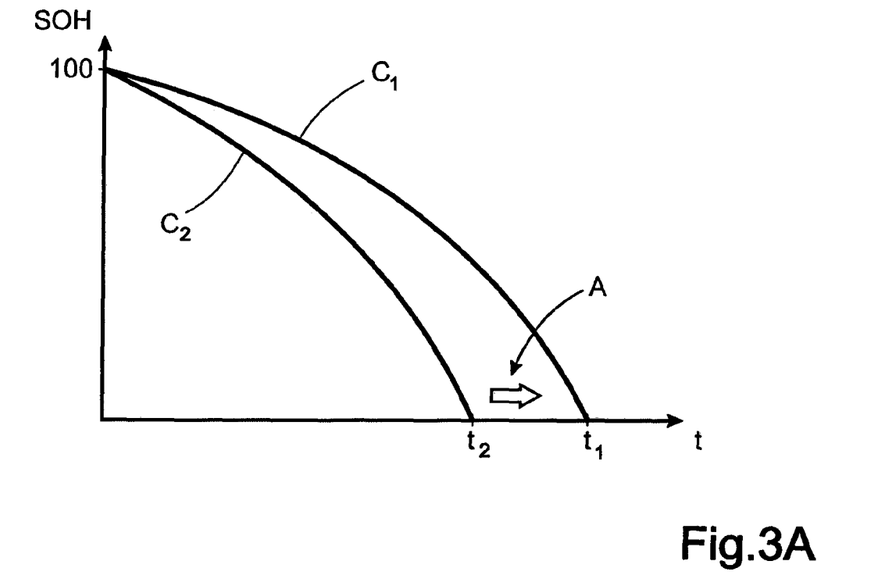
FIG. 3A shows a diagram illustrating the change in SOH over time for two identical or substantially identical components of the same type.

FIG. 3A shows a diagram illustrating the change in SOH over time for two identical or substantially identical components of the same type, such as two high voltage battery packs. Over time, minute differences in component quality and/or utilization for the components can result in a first component C1 having a life time t1, while a second component C2 will have a reduced life time t2.

As high voltage battery packs are relatively expensive, it is desirable to maximize the life time of such components. Due to the complexity and expense for replacing battery packs it is also desirable to replace both battery packs at the same time. Replacing battery packs "out of step" will also put an increased load on the new battery pack, which will be used more frequently than the older battery, and may also shorten the life time of the old battery pack, which may no longer be able to supply full power when required by the system.

Hence it would be preferable to operate the battery packs so that they will have the same or a similar life time. Ideally, this is achieved by shifting the lower SOH-curve in the direction of the arrow A in order to extend the life time t2 of the second battery pack.

Figure 3B:
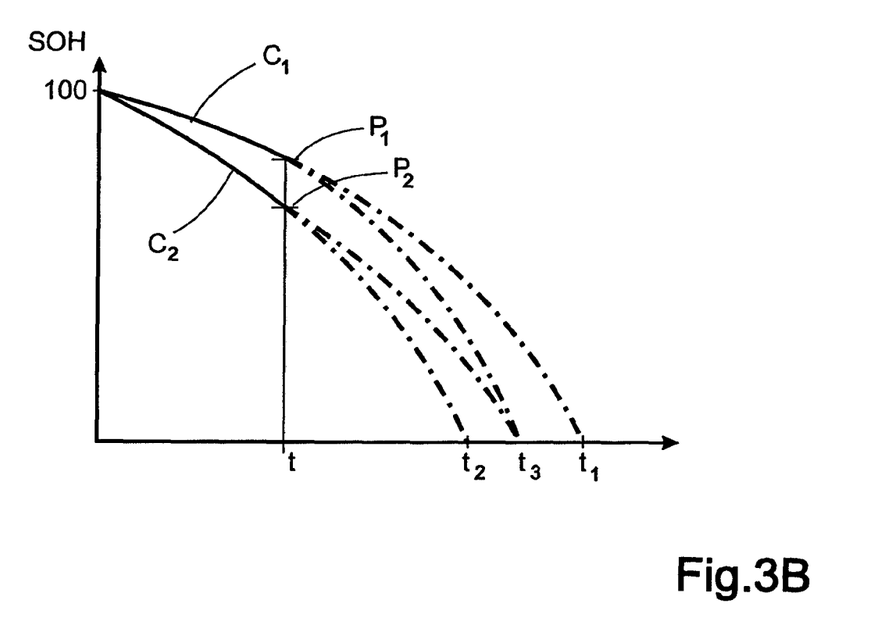
FIG. 3B shows a diagram illustrating the change in SOH over time for components controlled according to the invention.

FIG. 3B shows a diagram illustrating the change in SOH over time for components controlled according to the invention. According to the invention, identical or substantially identical components of the same type are monitored by a control unit so that the SOH for each respective component can be controlled and maintained between common upper and lower limits required for achieving a common parameter. In the illustrated case the common parameter is the life time of a first and a second component C1, C2, such as high voltage battery packs.

In FIG. 3B the upper limit is determined by the SOH curve of the first component C1. According to the invention, control unit using suitable sensors, such as voltage sensors, is arranged to monitor and register the state of health of each electrical component over time. Based on the detected values a predetermined parameter is predicted for each electrical component C1, C2. In this example the predicted parameter is the component life time t1, t2.

After a period of time t the control unit detects a deviation between the SOH curves for the first and second components. Here, a deviation has been detected when the SOH for the second component C2 falls below a predetermined lower limit at point P2, which limit can be set as a percentage or a number of percentage points below the first component C1 having the highest SOH, indicated at point P1.

Alternatively, or in addition, a deviation can be detected by comparing the predicted parameter relating to the life time t1, t2 for each electrical component, which parameter is calculated based on a current value of the derivative of the state of health for each electrical component C1, C2.

Hence, when the difference in SOH between points P1 and P2 exceeds a predetermined value, e.g. a percentage or a number of percentage points, and/or when the difference in life time $\Delta t=(t1-t2)$ for the first and, second components exceeds a predetermined value, the components are operated to balance the parameters towards a common value.

This involves selecting a control strategy where the component C1, having a higher SOH value and longer predicted life time, is operated predominantly, while reducing the loading on the second component, having a lower SOH value and a shorter predicted life time. In this way the SOH of the second component can be maintained between the upper and lower limits, in order to extend the predicted life time of the second component and minimize the difference in life time $\Delta t=(t1-t2)$ between both components. The state of health of each electrical component is monitored and registered continuously, allowing updated values for the predicted parameter to be calculated. The selected control strategy is maintained in operation until the difference in SOH and/or life time between the components is within the desired values.

In this example, the higher of the predicted parameters is deemed to be the desired common value. If this value is not achievable, then the SOH of the electrical components are maintained between the upper and lower limits to balance the parameters towards a common value t3 between the highest and the lowest predicted values t1, t2, as indicated in FIG. 3B. The latter scenario is more probable, as a predominant use of the first component will be likely to reduce its predicted life time. This method of operation ensures that the identical or substantially identical components C1, C2 of the same type are worn or degraded at the same or substantially the same rate.

In the above example, a selected control strategy is performed when predetermined limit (difference in SOH values; difference in predicted life time) is exceeded. Alternatively continuous monitoring and control can be used, wherein a selected control strategy is performed whenever any deviation occurs between the SOH curves with respect to any one of SOH difference, derivative of SOH or predicted life time.

In the above example, the predicted parameter is the remaining life time of an electrical component. However, the predicted parameter can also be the predicted remaining operating time until a functional state requiring repair or replacement of either component occurs. In both cases, an operating state inhibiting the use of the components is detected.

If several types of identical components are monitored then a condition could occur that puts the operation of the components in conflict. For instance, a control unit can indicate that the use of a first battery pack should be prioritized over a second battery pack in order to increase the remaining operating time of the second battery pack. At the same time the control unit can indicate that an electric traction motor associated with the second battery pack should be prioritized over an electric traction motor associated with the first battery pack in order to increase the remaining operating time of the latter electric motor. Such a conflict can be resolved by the use of a set of rules giving priority to the control of components which are more expensive and/or more labour intensive to replace or repair. In this way each type of components monitored can be controlled to optimize the remaining operating time of each component type in relation to other component types.

The present invention also relates to a computer program, computer program product and a storage medium for a computer all to be used with a computer for executing the method as described in any one of the above examples.

Figure 4:
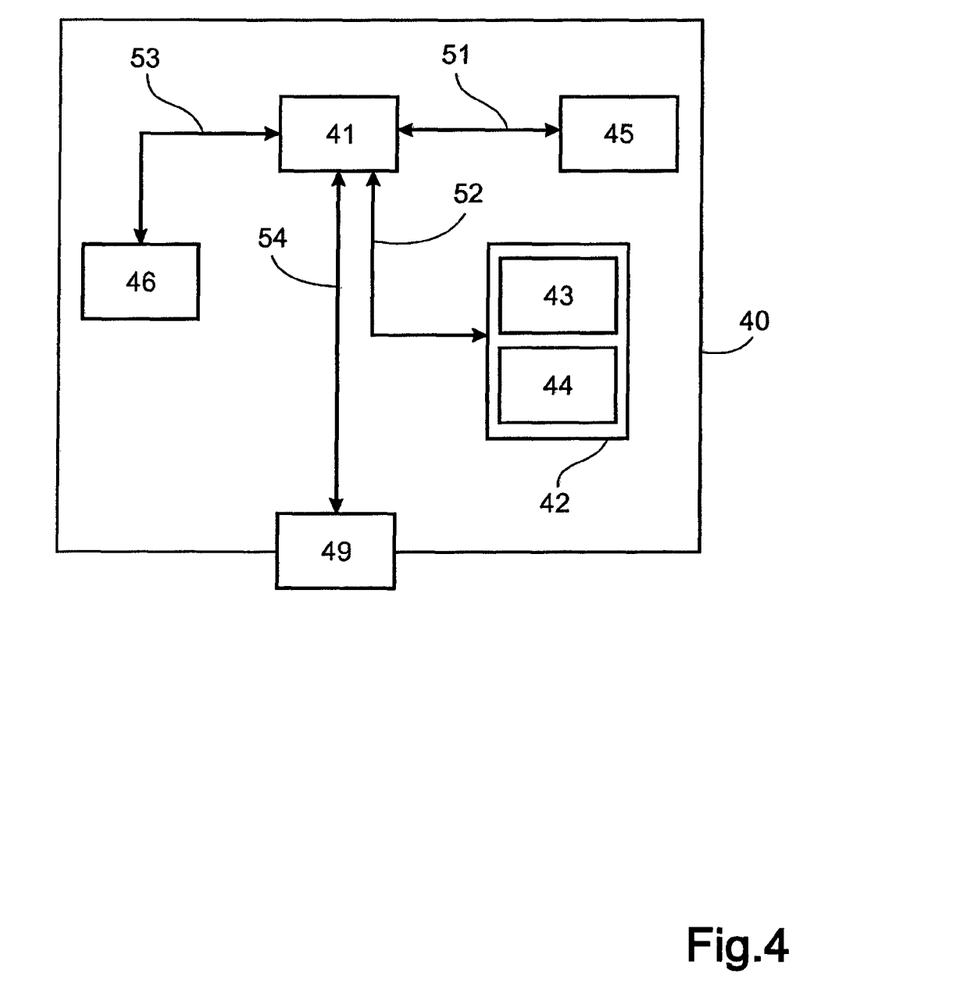
FIG. 4 shows the invention applied on a computer arrangement.

FIG. 4 shows the invention applied on a computer arrangement. FIG. 4 shows an apparatus 40 according to one embodiment of the invention, comprising a nonvolatile memory 42, a processor 41 and a read and write memory 46. The memory 42 has a first memory part 43, in which a computer program for controlling the apparatus 40 is stored. The computer program in the memory part 43 for controlling the apparatus 40 can be an operating system.

The apparatus 40 can be enclosed in, for example, a control unit. The data-processing unit 41 can comprise, for example, a microcomputer.

The memory 42 also has a second memory part 44, in which a program for controlling electrical components in a vehicle comprising multiple traction voltage systems according to the invention is stored. In an alternative embodiment, the program for controlling the electrical components is stored in a separate nonvolatile storage medium 45 for data, such as, for example, a CD or an exchangeable semiconductor memory. The program can be stored in an executable form or in a compressed state.

When it is stated below that the data-processing unit 41 runs a specific function, it should be clear that the data-processing unit 41 is running a specific part of the program stored in the memory 44 or a specific part of the program stored in the nonvolatile storage medium 45.

The data-processing unit 41 is tailored for communication with the storage memory 45 through a data bus 51. The data-processing unit 41 is also tailored for communication with the memory 42 through a data bus 52. In addition, the data-processing unit 41 is tailored for communication with the memory 46 through a data bus 53. The data-processing unit 41 is also tailored for communication with a data port 49 by the use of a data bus 54.

The method according to the present invention can be executed by the data-processing unit 41, by the data-processing unit 41 running the program stored in the memory 44 or the program stored in the nonvolatile storage medium 45.

The invention should not be deemed to be limited to the embodiments described above, but rather a number of further variants and modifications are conceivable within the scope of the following patent claims.

The invention claimed is:

1. Method for controlling electrical components in a vehicle comprising multiple traction voltage systems, wherein each traction voltage system comprises at least one electrical component, and which electrical component has the same function in each traction voltage system, the method involving the steps of:
   monitoring and registering the state of health of each electrical component over time;
   predicting a predetermined parameter for each electrical component, which parameter is related to a future operating state inhibiting the use of the components;
   determining a control strategy for each electrical component based on the state of health of the electrical components;
   controlling each electrical component based on the state of health of the electrical components to balance the parameters towards a common value to equalize predicted remaining operating times of the electrical components.

2. Method according to claim 1, comprising determining a control strategy for each of the electrical components using a current derivative of the state of health for each electrical component.

3. Method according to claim 1, comprising calculating the predicted remaining operating time for each electrical component based on a current value of the derivative of the state of health for each electrical component.

4. Method according to claim 3, comprising controlling the two or more electrical components based on the determined control strategy to equalize the predicted remaining operating times of the electrical components.

5. Method according to claim 3, comprising selecting a control strategy that reduces the loading on at least the electrical component having the shortest predicted remaining operating time.

6. Method according to claim 3, comprising selecting a control strategy that increases the loading on at least the electrical component having the longest predicted remaining operating time.

7. Method according to claim 3, wherein the predicted remaining operating time is the remaining time to a functional state requiring repair or replacement of either component.

8. Method according to claim 3, wherein the predicted operating time is the remaining life time of the electrical components.

9. Method according to claim 1, wherein each electrical component is a traction battery pack or a super-capacitor.

10. Method according to claim 1, wherein each electrical component is a traction motor connected to a driven axle.

11. Method according to claim 1, wherein each electrical component comprises a pair of traction wheel motors each connected to a wheel on a driven axle.

12. Method according to claim 1, wherein each electrical component is a power electronics component for controlling the traction voltage.

13. A computer comprising a computer program for performing the steps of claim 1 for controlling electrical components in a vehicle traction voltage system when the program is run on the computer.

14. A non-transitory computer readable medium carrying a computer program for performing the steps of claim 1 for controlling electrical components in a vehicle traction voltage system when the program product is run on a computer.

15. A control unit for controlling electrical components in a vehicle traction voltage system, the control unit being configured to perform the steps of the method according to claim 1.

16. A vehicle comprising multiple traction voltage systems, wherein each traction voltage system comprises at least one electrical component, and which electrical component has the same function in each traction voltage system, and where a control unit is arranged to perform the steps of:
 monitoring and registering the state of health of each electrical component over time;
 predicting a predetermined parameter for each electrical component, which parameter is related to a future operating state inhibiting the use of the components;
 determining a control strategy for each electrical component based on the state of health of the electrical components;
 controlling each electrical component based on the state of health of the electrical components to balance the parameters towards a common value to equalize predicted remaining operating times of the electrical components.

* * * * *